United States Patent
Iiyoshi et al.

(10) Patent No.: US 6,907,366 B2
(45) Date of Patent: Jun. 14, 2005

(54) ELECTRONIC MEASUREMENT APPARATUS HAVING A FUNCTION TO A DISPLAY A FUNCTION MENU OVER A PLURALITY OF PAGES IN A LIST AND FUNCTION MENU DISPLAY METHOD

(75) Inventors: Katsuhisa Iiyoshi, Kawasaki (JP); Takayuki Morikawa, Yokohama (JP); Yuji Kanno, Tokyo (JP); Hideo Zuinen, Atsugi (JP)

(73) Assignee: Anritsu Corporation, Tokyo (JP)

( * ) Notice: Subject to any disclaimer, the term of this patent is extended or adjusted under 35 U.S.C. 154(b) by 115 days.

(21) Appl. No.: 10/381,954
(22) PCT Filed: Jul. 26, 2002
(86) PCT No.: PCT/JP02/07618
  § 371 (c)(1),
  (2), (4) Date: Mar. 31, 2003
(87) PCT Pub. No.: WO03/012613
  PCT Pub. Date: Feb. 13, 2003

(65) Prior Publication Data
  US 2003/0191591 A1 Oct. 9, 2003

(30) Foreign Application Priority Data
  Aug. 1, 2001 (JP) .................................. 2001-233883

(51) Int. Cl.[7] .................................................. G06F 15/163
(52) U.S. Cl. ........................... 702/68; 702/67; 702/119; 702/120
(58) Field of Search ........................ 702/66–69, 119, 702/120, 74, 109, 116, 122, 177; 382/100; 704/260; 705/54; 713/200

(56) References Cited

U.S. PATENT DOCUMENTS 5,018,083 A * 5/1991 Watanabe et al. ........... 715/517
5,343,312 A * 8/1994 Hibi et al. ................... 358/520
5,769,269 A * 6/1998 Peters .......................... 221/7
6,088,029 A   7/2000 Guiberson et al. .......... 345/344
6,760,866 B2 * 7/2004 Swoboda et al. ............. 714/34

FOREIGN PATENT DOCUMENTS

| JP | 10-222556 A  | 8/1998  |
|----|--------------|---------|
| JP | 10-320025 A  | 12/1998 |
| JP | 8-75796 A    | 3/1999  |
| JP | 11-123653 A  | 5/1999  |
| JP | 11-174029 A  | 7/1999  |
| JP | 11-254596 A  | 9/1999  |
| JP | 2000-35450 A | 2/2000  |
| JP | 2000-111362 A| 4/2000  |
| JP | 2000-250793 A| 9/2000  |
| JP | 2001-21451 A | 1/2001  |
| JP | 2001-42989 A | 2/2001  |
| JP | 2001-127941 A| 5/2001  |

* cited by examiner

Primary Examiner—Marc S. Hoff
Assistant Examiner—Felix Suarez
(74) Attorney, Agent, or Firm—Frishauf, Holtz, Goodman & Chick, P.C.

(57) ABSTRACT

A storage stores data of plural function menus corresponding to plural function menu items composed of plural pages to be used in instruction of execution of mutually different plural functions to process tested data of an object displayed in a first region on a screen of a display section. A screen manager selectively reads out function menu data of one page corresponding to a specified function from data of plural function menus stored in the storage, in accordance with setting of a display state displayed on the screen, and displays in a second region different from the first region, corresponding to each of the plural function keys. A list display section reads out data of plural function menus of all pages corresponding to the specified function from data of plural function menus stored in the storage, depending on the operation of a list display key, and displays a list in a third region, different from the second region, including the first region.

32 Claims, 7 Drawing Sheets

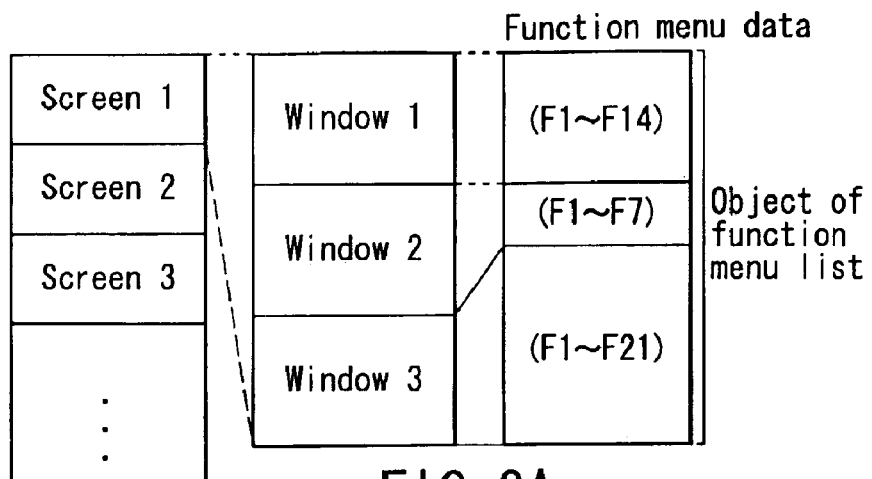
FIG. 3A
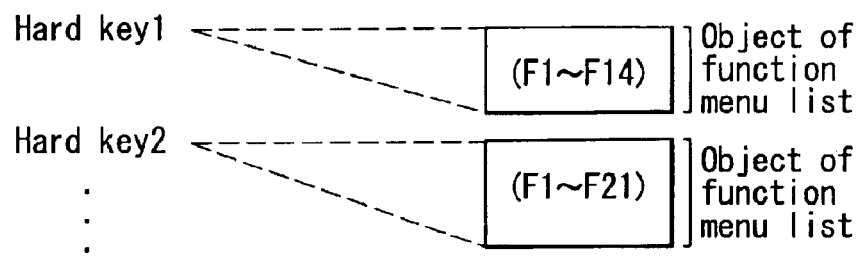
FIG. 3B
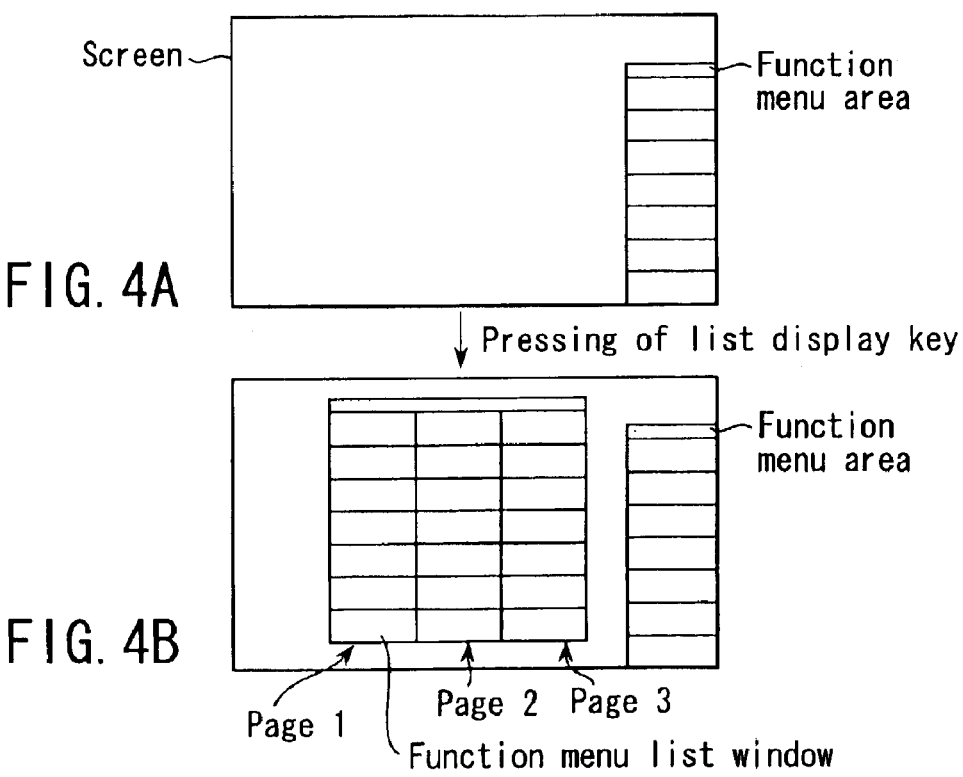
FIG. 4A
FIG. 4B

ELECTRONIC MEASUREMENT APPARATUS HAVING A FUNCTION TO A DISPLAY A FUNCTION MENU OVER A PLURALITY OF PAGES IN A LIST AND FUNCTION MENU DISPLAY METHOD

This application is a U.S. National Phase of International Application No. PCT/JP/07618 filed on Jul. 26, 2002.

TECHNICAL FIELD

The present invention relates to an electronic test apparatus and a function menu display method used therefor, and more particularly to an electronic testing apparatus having a function menu for listing plural pages arranging plural menu items on one screen, to be used in instruction of execution of various functions for processing test data of objects displayed on a screen, and a function menu display method therefor.

BACKGROUND ART

Generally, in a test data display system used in electronic test apparatuses such as communication characteristic testing apparatus, a display section for displaying tested data of objects on a screen is provided in an operation panel, and plural function keys for execution of a plurality of functions for processing the test data of objects are also provided in the operation panel.

In such a test data display system, a function menu arranging plural menu items corresponding to plural function keys are displayed on the screen of the display section.

The user refers to a menu item displayed as a function menu on the screen of the display section, and presses the function key corresponding to the menu item of the function desired to be executed, so that the execution of the function is instructed to the electronic test apparatus.

In such an electronic test apparatus, usually, the function menu corresponding to each function is displayed on the screen.

Therefore, to execute a certain function, the screen must be changed over to the one corresponding to a desired function, and the function menu is changed over by pressing the function key corresponding to the desired function.

Recently, as the data processing and display system used in electronic testing apparatuses can handle multiple functions, multiple function menus are needed.

Therefore, these function menus can be displayed on the screen of the display section only by pressing the function keys provided in the operation panel, and the function menus corresponding to one screen are prepared in plural pages or in plural layers.

Thus, in the data processing and display system used in multifunctional electronic test apparatus, since the number of pages or layers of function menus is increased, it is hard for the user to instantly select a desired function on the screen of the display section.

For example, if the user forgets some of the function menus, when a certain function is executed, the user must change over the pages or layers of the function menus on the screen of the display section, and search for the function menu with the desired menu item.

Accordingly, in the data processing used in the electronic testing apparatus or test data display system, the operational efficiency is lowered despite the multi-function ability.

DISCLOSURE OF INVENTION

This invention is devised in the light of the above circumstances, and it is an object thereof to provide an electronic test apparatus having a function of list display of a function menu composed of plural pages arranging plural menu items on one screen for use in instruction of execution of mutually different plural functions for processing test data of objects displayed on a screen only by operating a list display key, thereby capable of easily selecting and executing the function menu for executing a desired function from the list display of a function menu shown on the same screen of the display section, even when there is a function menu composed of plural pages corresponding to multiple functions.

It is another object of the invention, devised in the same background, to provide a method for function menu display of an electronic test apparatus having a function of list display of a function menu composed of plural pages arranging plural menu items on one screen for use in instruction of execution of mutually different plural functions for processing tested data of objects displayed on a screen only by manipulating a list display key, thereby capable of easily selecting and executing the function menu for executing a desired function from the list display of a function menu shown on the same screen of the display section, even when there is a function menu composed of plural pages corresponding to multiple functions.

In order achieve the above object, according to a first aspect of the present invention, there is provided an electronic test apparatus comprising:

a testing unit which test an object;

a display section which has a screen provided in an operation panel, and displays test data of the object tested by the test unit in a first predetermined region on the screen;

plural function keys which are provided at predetermined positions close to the screen of the display section in the operation panel, and instruct execution of mutually different plural functions to process the tested data of the object displayed on the screen of the display section;

a storage section which stores data of plural function menus corresponding to plural function menu items to be used for instructing the execution of mutually different plural functions to process the test data of the object displayed on the screen of the display section, and stores the data of the plural function menus in plural pages when numbers of the plural function menu items are larger than numbers of the plural function keys;

a screen manager which selectively reads out function menu data of one page corresponding to a predetermined function from the data of the plural function menus stored in the storage section, in correspondence with setting of a display state displayed on the screen of the display section, and displays in a second predetermined region different from the first predetermined region, corresponding to each of the plural function keys on the screen of the display section;

a list display key which is provided at a predetermined position of the operation panel, and inputs an instruction for executing list display of function menus; and a function menu list display section which reads out data of plural function menus of all pages corresponding to the predetermined function from the data of the plural function menus stored in the storage section depending on the operation of the list display key, and presents a list display by relating to page information their in a third predetermined region, different from the second predetermined region, including the first predetermined region on the screen of the display section.

According to a second aspect of the present invention, there is provided the electronic test apparatus according to the first aspect, wherein the screen manager displays the function menu data of the one page by relating with page information its when data of plural function menus composed of plural pages is stored in the storage section.

According to a third aspect of the present invention, there is provided the electronic test apparatus according to the second aspect, further comprising a page change key provided at a predetermined position in the operation panel, wherein the screen manager changes over the data of plural function menus composed of plural pages stored in the storage section, depending on the operation of the page change key, and displays as function menu data of the one page.

According to a fourth aspect of the present invention, there is provided the electronic test apparatus according to the first aspect, wherein the screen manager enables to select at least one corresponding function menu data in the function menu data of one page displayed in the second predetermined position on the screen of the display section, depending on the operation of at least one of the plural function keys.

According to a fifth aspect of the present invention, there is provided the electronic test apparatus according to the first aspect, further comprising:

plural hard keys provided at predetermined positions in the operation panel, to select a desired specific function menu item from the plural function menu items, wherein the screen manager selectively reads out the function menu data of one page corresponding to a desired specific function from the data of plural function menus stored in the storage section, depending on the operation of the plural hard keys, and displays in the second predetermined position corresponding to each of the plural function keys on the screen of the display section.

According to a sixth aspect of the present invention, there is provided the electronic test apparatus according to the first aspect, wherein the function menu list display section makes a list of function menus of plural pages when the data of plural function menus of all pages corresponding to the predetermined function cannot be displayed in one page of function menu list due to limitation of a display size of the screen, and the screen manager changes over and displays the function menu list of plural pages created by the function menu list display section, depending on an instruction for changeover of list display.

According to a seventh aspect of the present invention, there is provided the electronic test apparatus according to the first aspect, wherein the function menu list display section unifies function menu items common in each page when making a function menu list, and displays so that the same menu item may not be duplicated in each page on the function menu list. According to an eighth aspect of the present invention, there is provided the electronic test apparatus according to the first aspect, wherein the function menu list display section sets a function menu list window on the display screen when the execution of list display of function menu is instructed by the list display key while a test result display window and a parameter setting window are displayed on the display screen, and displays the function menu list including the function menus corresponding to the test result display window and function menu list window, and also sets a cursor to select each menu item in the function menu list window, and the screen manager changes over the display of the window corresponding to the menu item selected depending on the moving operation of the cursor.

According to a ninth aspect of the present invention, there is provided the electronic test apparatus according to the first aspect, wherein the screen manager displays a specific display region in the screen corresponding to the menu item when an instruction for selecting a specific menu item in the function menu is inputted, and also displays by adding a specific display attribute showing that the function can be executed in the display region.

According to a tenth aspect of the present invention, there is provided the electronic test apparatus according to the first aspect, wherein the function menu list display section makes a list display of function menus including the function menu to be displayed by the screen manager when an execution instruction of function menu list display is inputted by the list display key during display of the function menu corresponding to a specific function by the screen manager.

According to an eleventh aspect of the present invention, there is provided a method for function menu display of an electronic test apparatus comprising:

preparing a test unit, a display section having a screen, plural function keys, a storage section, and a list display key;

displaying test data of an object tested by the test unit in a first predetermined region on the screen of the display section;

storing in the storage section as data of plural function menus in plural pages if numbers of plural function menu items is larger than numbers of plural function keys, when storing data of plural function menus corresponding to plural function menu items to be used in instruction of execution of mutually different plural functions to process the test data of the object displayed on the screen of the display section;

selectively reading out function menu data of one page corresponding to a desired specific function from data of plural function menus stored in the storage section, in correspondence with setting of a display state displayed on the screen of the display section, and displaying in a second predetermined region different from the first predetermined region, corresponding to each one of the plural function keys on the screen of the display section;

inputting an instruction for executing list display of function menus by operating the list display key; and reading out data of plural function menus of all pages stored in the storage section depending on the operation of the list display key, and presenting a list display by relating to page information their in a third predetermined region, different from the second predetermined region, including the first predetermined region on the screen of the display section.

According to a twelfth aspect of the present invention, there is provided the method for function menu display of an electronic test apparatus according to the eleventh aspect, further comprising:

displaying the function menu data of the one page by relating to page information its when the function menu data of one page is stored as data of plural function menus composed of plural pages in the storage section.

According to a thirteenth aspect of the present invention, there is provided the method for function menu display of an electronic test apparatus according to the twelfth aspect, further comprising:

preparing a page change key; and displaying the function menu data of the one page as function menu data of the one page by changing over the data of plural function menus of plural pages stored in the storage section, depending on the operation of the page change key.

According to a fourteenth aspect of the present invention, there is provided the method for function menu display of an electronic test apparatus according to the eleventh aspect, further comprising:

enabling to select at least one corresponding function menu data, out of the function menu data of one page displayed in the second predetermined region on the screen of the display section, depending on the operation of at least one of the plural function key.

According to a fifteenth aspect of the present invention, there is provided the method for function menu display of an electronic test apparatus according to the eleventh aspect, further comprising:

preparing plural hard keys to select a desired specific function menu item from the plural function menu items; and selectively reading out the function menu data of one page corresponding to a desired specific function from the data of plural function menus stored in the storage section, depending on the selective operation of the plural hard keys, and displaying in the second predetermined region corresponding to each one of the plural function keys on the screen of the display section.

According to a sixteenth aspect of the present invention, there is provided the method for function menu display of an electronic test apparatus according to the eleventh aspect, further comprising:

creating a list of function menus of plural pages when the data of plural function menus of all pages corresponding to the specified function cannot be displayed in one page of function menu list due to limitation of the display screen size; and changing over and displaying the list of function menu plural pages, depending on changeover instruction of list display.

According to a seventeenth aspect of the present invention, there is provided the method for function menu display of an electronic test apparatus according to the eleventh aspect, further comprising:

unifying function menu items common in each page when making the function menu list, and displaying the function menu list so that the same menu item may not be duplicated in each page on the function menu list.

According to an eighteenth aspect of the present invention, there is provided the method for function menu display of an electronic test apparatus according to the eleventh aspect, wherein a function menu list window is set on the display screen, for the function menu list display, when the execution of lists display of function menu is instructed by the list display key while a test result display window and a parameter setting window are displayed on the display screen, and the function menu list including the function menus corresponding to the test result display window and the function menu list window is displayed, and also a cursor to select each menu item in the function menu list window is set, and the display of the window is changed over corresponding to the menu item selected depending on a movement of the cursor.

According to a nineteenth aspect of the present invention, there is provided the method for function menu display of an electronic test apparatus according to the eleventh aspect, wherein for display of the function menu data of one page, a specific display region in the screen corresponding to the menu item is displayed when an instruction for selecting a specific menu item in the function menu is inputted, and is also displayed by adding a specific display attribute showing that the function can be executed in the display region.

According to a twentieth aspect of the present invention, there is provided the method for function menu display of an electronic test apparatus according to the eleventh aspect, wherein for display of the function menu list, a list of function menus including the function menu to be displayed is displayed when an instruction of execution of function menu list display is inputted by the list display key during display of the function menu corresponding to the specific function.

BRIEF DESCRIPTION OF DRAWINGS

FIGS. 3A and 3B are diagrams explaining function menu data 13a of function menu displayed on a display screen of a display unit 19 by a screen manager 10a in FIG. 1;

FIGS. 4A and 4B are diagrams explaining outline of a function menu area provided on the display screen of the display unit 19 and a function menu list window displayed by pressing a list display key 24 provided in the panel unit 14 in FIG. 1;

FIGS. 6A to 6D are diagrams showing specific examples of a display screen before and after display of the function menu list window in the display unit 19 in FIG. 1.

BEST MODE FOR CARRYING OUT THE INVENTION

Figure 1:
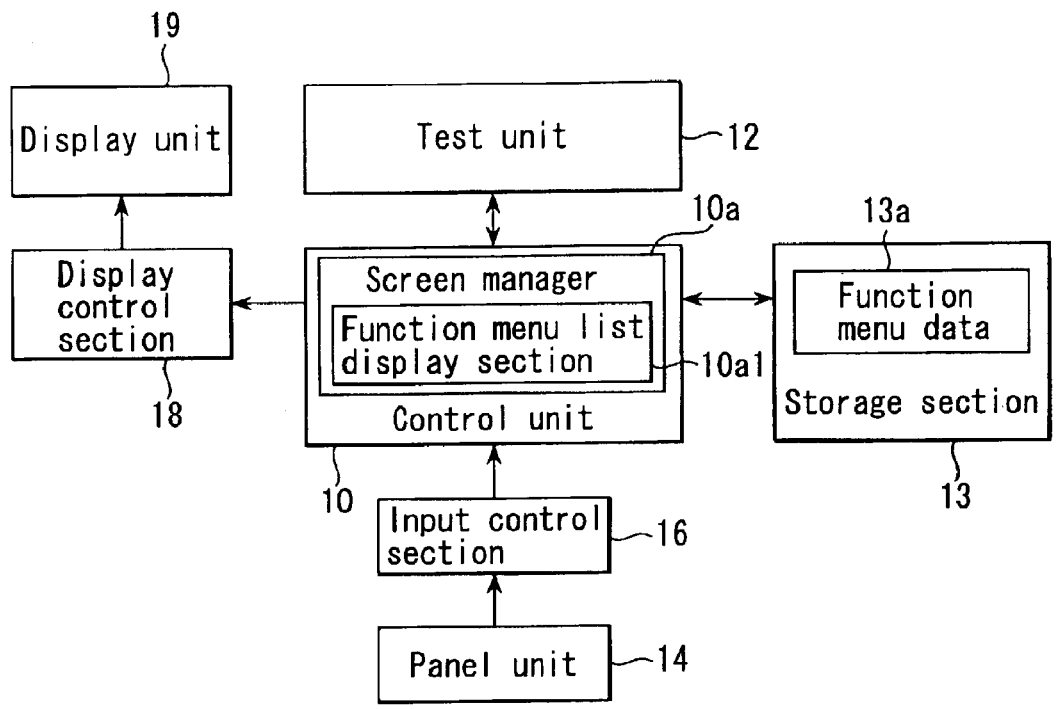
FIG. 1 is a block diagram showing a configuration of an electronic test apparatus in one embodiment of the present invention.

Reference will now be made in detail to the presently preferred embodiments of the invention as illustrated in the accompanying drawings, in which like reference numerals designate like or corresponding parts.

Referring now to the drawings, one embodiment of the invention will be described below.

FIG. 1 is a block diagram showing a configuration of an electronic test apparatus in the embodiment of the invention.

As shown in FIG. 1, the electronic test apparatus of the embodiment comprises a control section 10, a test unit 12, a storage section 13, a panel unit 14, an input control section 16, a display control section 18, and a display unit 19.

The control section 10 controls the respective sections constituting the electronic test apparatus by executing programs by means of a CPU or the like.

The control section 10 executes the process corresponding to the operated key, which is described below, provided in the panel unit 14.

A screen manager 10a provided in the control section 10 manages a display state of a screen 19a of the display unit 19 so as to display according to the instruction from the panel unit 14 to be inputted through the input control section 16.

That is, the screen manager 10a controls the display state of the screen 19a of the display unit 19, such as the display of a function menu arranging plural menu items to be used in instruction of execution of functions provided in the electronic test apparatus, on the basis of function menu data 13a as described below stored in the storage section 13, setting of window on the display screen, or display in the window.

The control section 10 executes the function corresponding to pressing of a function key 20, which is described below, provided in the panel unit 15, according to the function menu displayed on the screen 19a of the display unit 19.

The screen manager 10a also comprises a function menu list display section 10a1.

This function menu list display section 10a1 executes the following list display of function menus when a list display key 24, which is described below, provided in the panel unit 14 is pressed.

That is, the function menu list display section 10a1 executes, depending on the operation of the list display section 24, a list display of function menus including the function menu to be displayed on the screen, for executing a specific function to be displayed, or a list display of function menus including the function menu to be displayed, when the function menu corresponding to a specific function instructed by specific hard keys 31a, 31b (see FIG. 2), etc. provided in the panel unit 14 is displayed.

The test unit 12 is a unit for executing various tests, under the control of the control section 10, relating to characteristics of, for example, various communication signals.

The storage section 13 stores various preliminarily data handled in the electronic test apparatus, and stores the function menu data 13a of the function menu to be displayed on the screen corresponding to the function provided in the electronic test apparatus or function menu corresponding to a specific function.

In this case, the storage section 13 stores plural function menu items as plural function menu data composed of plural pages when the number thereof is larger than the number of the plural function keys 20 when storing the plural function menu data 13a corresponding to the plural function menu items to be used in instruction for execution of mutually different plural functions for processing the tested data of objects displayed on the screen 19a of the display unit 19.

The panel unit 14 is for inputting various instructions to the electronic test apparatus from a user, and incorporates the display unit 19 having the screen 19a for displaying various pieces of information, and various keys.

A specific example of the panel unit 14 will be described later (see FIG. 2).

The input control section 16 receives input by various keys provided in the panel unit 14, and informs the control section 10 of the detail of the key operation.

The display control section 18 controls display of various pieces of information in the display unit 19 under the control of the control section 10.

The display unit 19 displays information on the screen 19a as being controlled by the display control section 18.

Plural areas are provided on the display screen 19a of the display unit 19, and the information assigned in each area is displayed.

In this embodiment, it is assumed that an area for displaying function menu (function menu area) is provided at the right side of the screen of the display unit 19.

Figure 2:
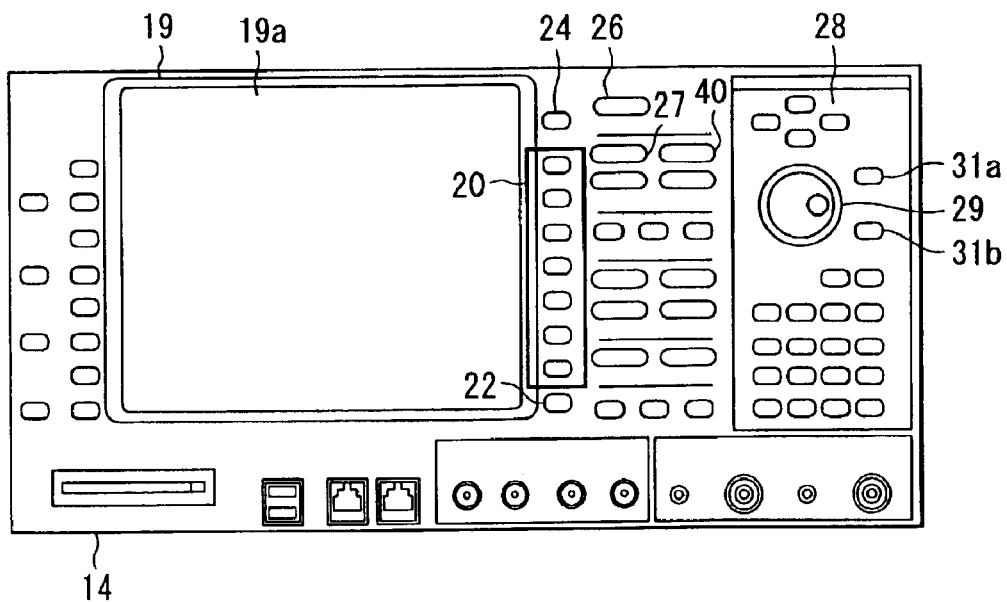
FIG. 2 is a view showing an example of an operation panel of a panel unit 14 in FIG. 1.

FIG. 2 is a view showing an example of an operation panel of the panel unit 14.

That is, as shown in FIG. 2, the operation panel of the panel unit 14 incorporates the display screen 19a of the display unit 19 for displaying the screen for various test results or operations by the test unit 12, and plural keys to be operated by the user.

The plural keys include a function key 20, a page change key 22, a list display key 24, a screen change key 26, a focus key 27, a cursor key 28, an encoder 29, and a set key 41.

The panel unit 14 further comprises plural hard keys 31a, 31b, . . . for inputting execution instructions for display of function menu corresponding to a specific function.

The function key 20 is a key for instructing menu items in the function menu displayed at the right side of the display screen 19a of the display unit 19, as described below.

For example, as the function key 20, seven keys from F1 to F7 are provided.

Therefore, in the function menu area in the display screen 19a, a function menu arranging seven menu items corresponding to the seven function keys 20 is displayed (however, it is not always required that menu items corresponding to all function keys 20 should be provided in the function menu).

The page change key 22 is a key used for changing over the pages of the function menu displayed at the right side of the display screen 19a of the display unit 19.

As mentioned above, only seven menu items corresponding to the seven function keys 20 can be arranged in the function menu.

Therefore, when eight or more menu items are present, a function menu for plural pages is prepared.

When a function menu for plural pages is prepared, by pressing the page change key 22 as mentioned above, the function menu pages can be sequentially changed over.

The list display key 24 is a key used for instructing a list display of function menus.

The detail of the function menu list window displayed when the list display key 24 is pressed is explained later.

The screen change key 26 is a key used for instructing changeover of display content displayed on the display screen 19a of the display unit 19.

The electronic test apparatus has a plurality of screens corresponding to the functions, and the display state of the screen 19a is changed over sequentially by operation of the screen change key 26.

The focus key 27 is for instructing changeover of windows to be used among plural windows displayed on the display screen 19a of the display unit 19.

That is, the display screen 19a of the display unit 19 comprises windows corresponding to specific functions. When the focus key 27 is pressed, the windows to be operated are changed over sequentially, so that the user can execute a desired function.

In the following explanation, the window that can be operated is described as an active window, and other windows are shown as inactive windows.

The cursor key 28 is a key used for instructing a direction in which the cursor is moved set in the window of the display screen 19a of the display unit 19, or a predetermined direction in the display screen.

The set key 41 is a key for setting the moving position of the cursor or the like.

The encoder 29 is an operating member for moving the cursor or numerical value of a parameter by rotation, and instructing input or decision of selection of parameters when pressed.

The function menu data 13a of the function menu displayed in the display screen 19a of the display unit 19 by the screen manager 10a is explained below by referring to FIGS. 3A and 3B.

The electronic test apparatus has a plurality of screens (Screens 1, 2, 3, . . . ) depending on the functions, as shown in FIG. 3A.

Each one of Screens 1, 2, 3, . . . comprises plural windows corresponding to specific functions (in the example in FIG. 3A, Windows 1, 2, 3 for Screen 1).

By operation of the screen change key 26, when a certain screen is displayed, plural windows prepared on this screen can be sequentially turned to active windows by operation of the focus key 27.

In each window, the function data of function menu displayed when the window becomes active is prepared in correspondence to each other.

In the example shown in FIG. 3A, for instance, in window 1, function menu data including menu items F1 to F14 (function menu data of two pages) is prepared.

In window 2, function menu data including menu items F1 to F7 (function menu data of one page) is prepared.

In window 3, function menu data including menu items F1 to F21 (function menu data of three pages) is prepared.

Therefore, while a certain screen 1 is being displayed, when execution of list display of function menu is executed by the list display key 24, a function menu list is prepared and displayed, concerning the function menu data prepared respectively for windows 1, 2, 3 by the function menu list display section 10a1.

The electronic test apparatus further incorporates function menu data corresponding to hard keys (1, 2, . . . ) 31, 32, . . . for inputting execution instructions of display of function menu corresponding to specific functions.

For example, relating to the hard key (1) 31a, it shows data of function menu including menu items F1 to F14 (function menu data of two pages) is prepared.

Relating to the hard key (1) 31a, it shows data of function menu including menu items F1 to F21 (function menu data of three pages) is prepared.

Therefore, in a operated state of any one of the hard keys 31a, 31b, . . . , when execution of list display of function menu is instructed by the list display key 24, the function menu list is compiled and displayed, concerning the function menu data corresponding to a specific hard key to be displayed by the function menu list display section 10a1.

FIGS. 4A and 4B show an outline of the function menu area provided in the display screen 19a of the display unit 19 and the function menu list window to be displayed by pressing of the list display key 24.

As shown in FIG. 4A, a function menu area is provided at the right side of the display screen.

The screen manager 10a displays the function menu by the display control section 18 so that each menu item of the function menu may be positioned corresponding to the key position of the function key 20 provided next to the right side of the display screen 19a on the operation panel of the panel unit 14.

When the user presses the list display key 24, the function menu list display section 10a1 compiles a function menu list by using the function menu data 13a of the function menu of each window on the screen being presently displayed, and displays in the function menu list window of the display screen 19a as shown in FIG. 4B.

Herein, the size of the function menu list window to be displayed on the display screen 19a can be freely set.

In the example shown in FIG. 4B, the function menu list window displays a list of function menu composed of three pages, but the function menu of other number of pages may be similarly displayed in list.

Further, since multiple function menus are prepared for the screen (window) to be displayed, if a list of function menus of one page cannot be displayed completely due to inadequate display screen size, a plurality of function menu lists can be compiled.

In this case, if the instruction for changing over the display of the function menu list windows is made through the input control section 16, the page manager 10a sequentially changes over the function menu lists in the function menu list window according to the instruction.

If a function menu corresponding to a specific function is displayed in the function menu area by pressing a specific hard key, when the list display key 24 is pressed by the user, the function menu list display section 10a1 creates a function menu list by using the function menu data 13a of the function menu corresponding to the specific function being presently displayed, and similarly displays in the function menu list window.

Specific examples of lists display of function menu corresponding to operation on the list display key 24 provided in the panel unit 14 are explained while referring to FIGS. 5A, 5B, 5C and 5D.

FIGS. 5A, 5B, 5C and 5D show the relation of a certain screen 1, plural windows 1 to n included in the screen 1, function menus provided in the windows 1 to n, and function menu lists displayed when the list display key 24 is pressed while the screen 1 is being displayed.

Figure 5A:
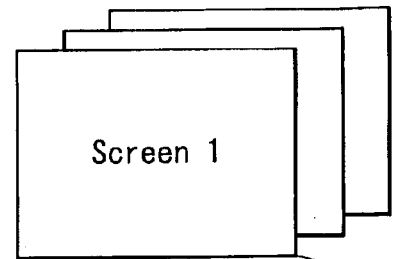
FIGS. 5A to 5D are diagrams explaining a specific example of list display of function menu corresponding to operation of the list display key 24 provided in the panel unit 14 in FIG. 1.
Figure 5B:
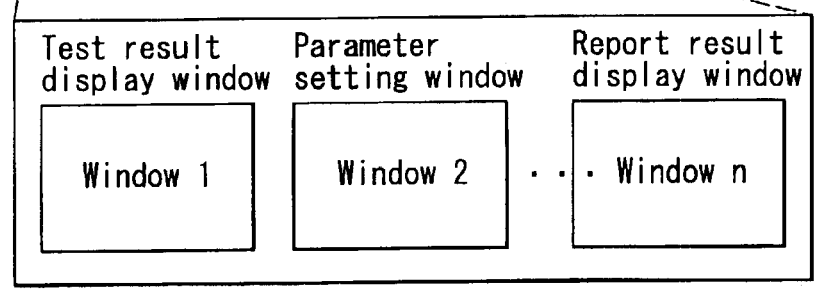

That is, the screen 1 shown in FIG. 5A includes a display result display window (window 1), parameter setting window (window 2), and report result display window (window n) as shown in FIG. 5B.

Figure 5C:
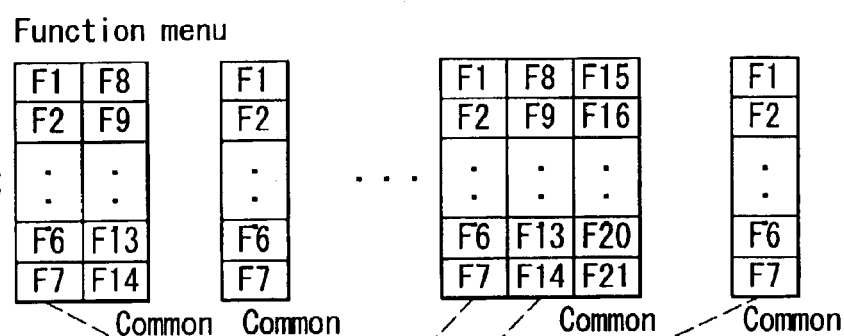
Figure 5D:
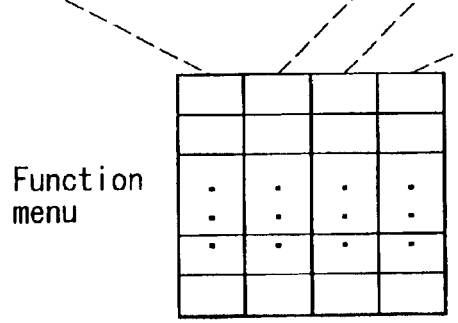

Supposing the test result window is active, herein, as shown in FIG. 5C, of the menu items F1 to F14 prepared as the function menu to be displayed in window 1, F1 to F7 are displayed as the function menu of a first page, and F8 to F14 as function menu of a second page, as shown in FIG. 5D.

Similarly, when the parameter-setting window of window 2 is active, menu items F1 to F7 prepared as the function menu to be displayed in widow 2 are arranged and displayed as function menus of one page as shown in FIG. 5D.

When the report result display window of window n is active, menu items of F1 to F21, that is, menu items of F1 to F7, F8 to F14, and F15 to F21 are arranged and displayed as function menu of one page as shown in FIG. 5D.

Herein, function menus F8 to F14 corresponding to window 1, F1 to F7 of window 2, and F15 to F21 of window n are common menu items of the same contents.

When the list display key 24 is pressed, the function menu list display section 10a1 compiles a function menu list corresponding to each window by using the function menu data 13a corresponding to the screen 1 to be displayed presently, and a function menu list window is provided, and the list is displayed in this window.

The function menu list display section 10a1 unifies the function menu items common in each window when compiling the function menu list, so that the same menu item may not be duplicated in the function menu list.

In the function menu area, only the function menu of the presently active window is displayed, but in the function menu list displayed by instruction on the list display key 24, whether active or inactive, the function menus corresponding to all windows included in the screen to be display are displayed in a list.

FIGS. 6A, 6B, 6C and 6D show specific examples of the display screen 19a before and after display of the function menu list window 32.

Figure 6A:
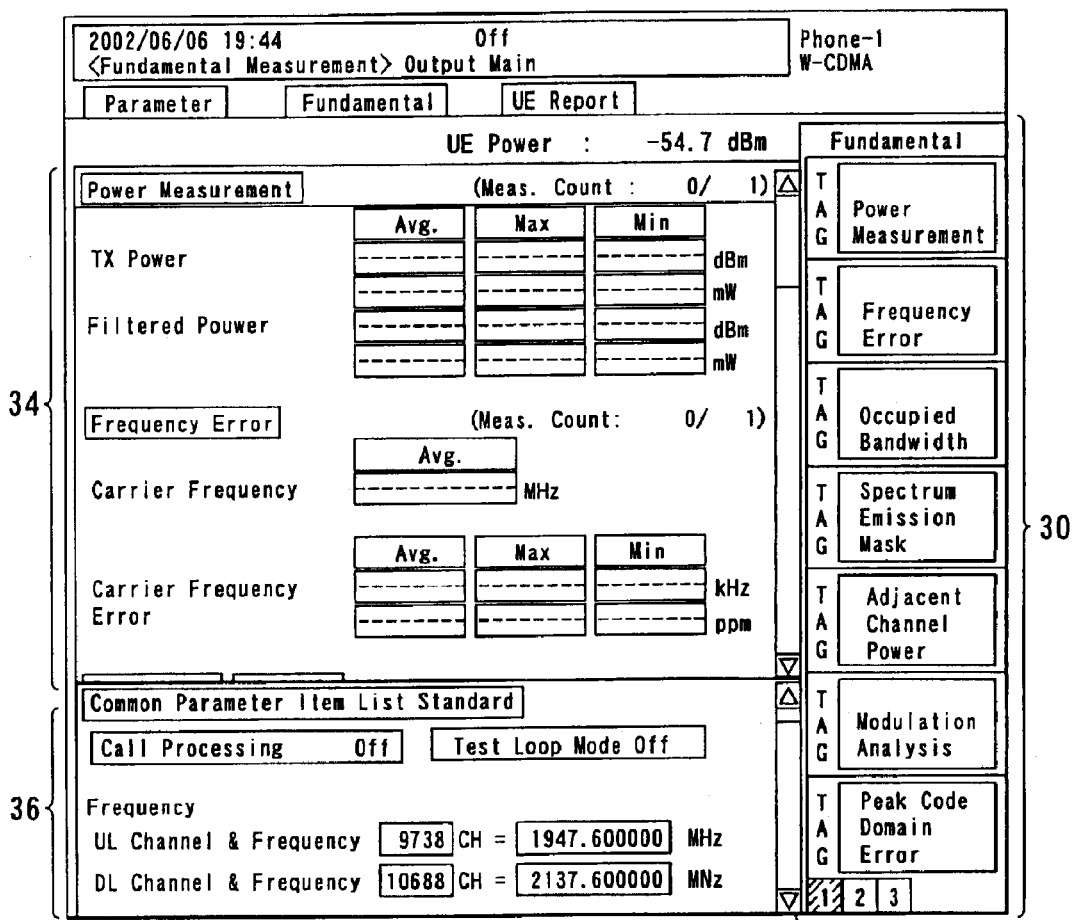

First, FIG. 6A shows a specific example of the display screen 19a when the hard key 31b is operated for inputting the execution instruction of display of function menu corresponding to a specific function in the panel unit 14 shown in FIG. 2.

In this case, at the right side in the display screen 19a, the function menu 30 of the first page is displayed, and it is shown that the function menu data of three pages, 1, 2, 3, is prepared in the lowest area.

The screen 19a of the present display includes a test result display window 34 and a parameter setting window 36.

In this case, since the test result display window 34 is an active window, the function menu 30 includes the menu item corresponding to the test result display window 34.

Figure 6B:
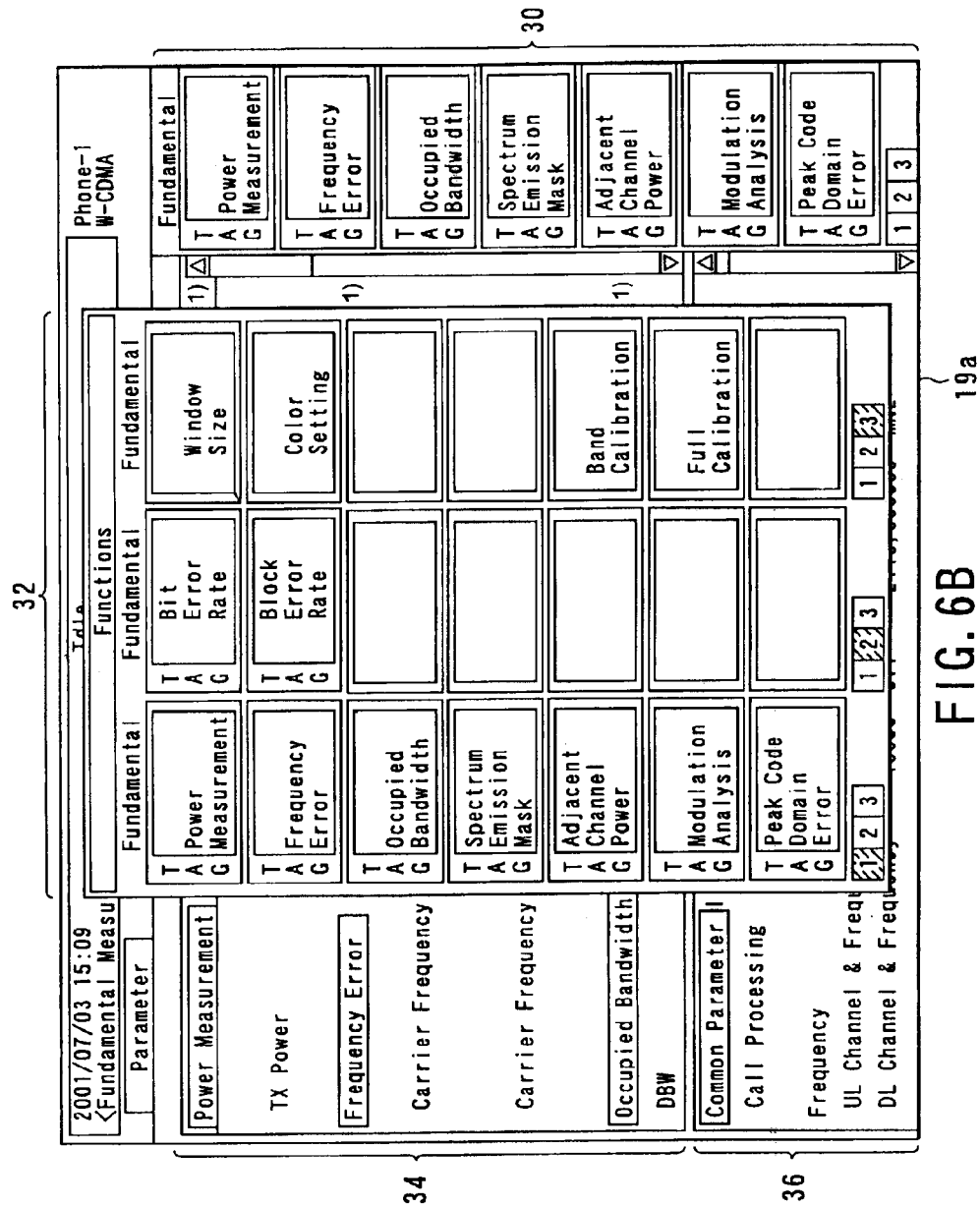

FIG. 6B shows a specific example of the display screen 19a when the list display key 24 is pressed in the state in FIG. 6A.

In FIG. 6B, the function menu list window 32 is displayed in partly overlapped state with the test result display window 34 and parameter setting window 36.

In this case, the test result display window 34 and parameter setting window 36 are displayed only in part due to limitation of the size of display screen, but usually, when active (the state in FIG. 6A), by scrolling by using the cursor key 28 or the like, all data displayed in the window can be checked.

Tags are set in the function menu 30 and function menu list window 32.

The tag indicates a major item summing up parameters and display items shown in the screen and window.

In the test result display window 34 in FIGS. 6A and 6B, "Power Test," "Frequency Error," and "Occupied Bandwidth" are tags.

That is, as shown in FIG. 6A, during display of the test result display window 34 and parameter setting window 36, when execution of list display of function menu is instructed by the list display key 24, the function menu list display section 10a1 sets the function menu list window 32 as shown in FIG. 6B. Thus, the function menu list including the function menu corresponding to the test result display window 34 and parameter setting window 36 is displayed.

In this case, function menus of three pages are displayed in list in the function menu list window 32.

In each lower part of the function menus of three pages displayed in the list in the function menu list window 32, columns of pages 1, 2, 3 are provided, and the page indicated by shading is the page of the corresponding function menu.

Figure 6C:
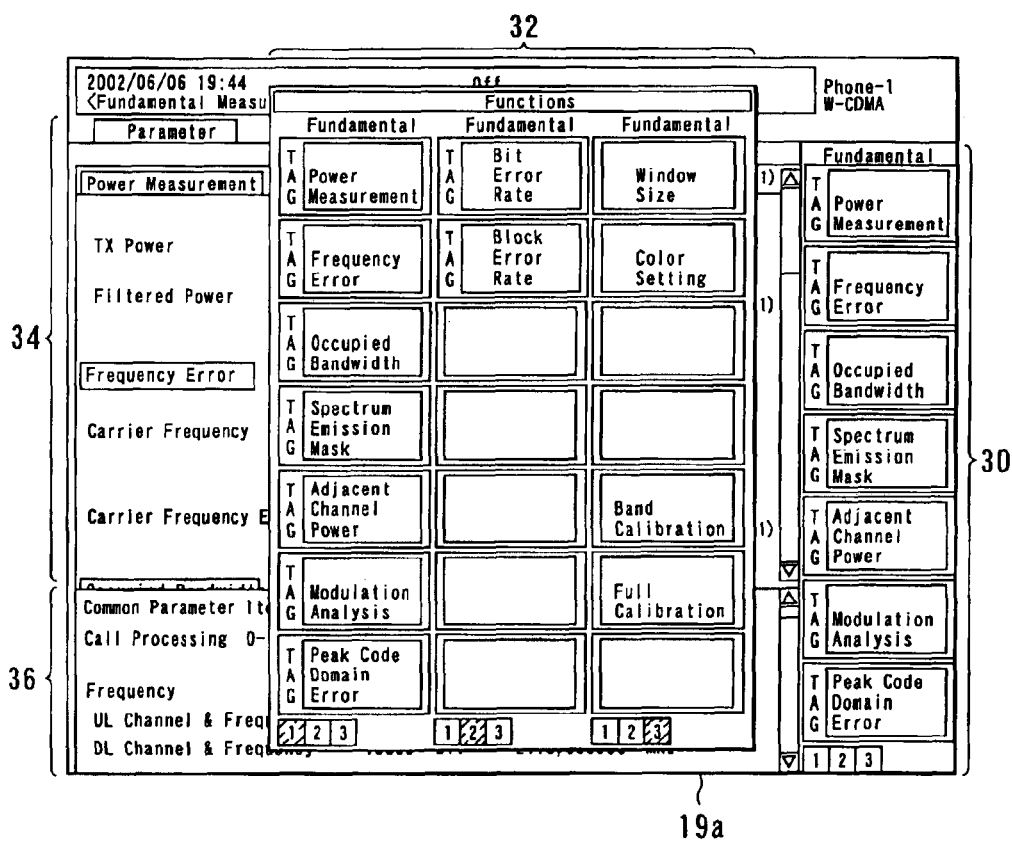

FIG. 6C shows a specific example of the display screen 19a in which the cursor 41 is movably set in order to select a menu item, in the function menu list window 32.

That is, in the displayed state of the function menu list window 32, when the cursor key 28 or encoder 29 is operated, the function menu list display section 10a1 moves the cursor 41 in each menu item of the function menu list window 32 accordingly.

As a result, the cursor 41 is moved to the position of the menu item desired by the user, and when determination of selection is displayed by pressing the set key 40 or encoder 29, the screen manager 10a changes over the display of window corresponding to the selected menu item.

In each function menu, as shown in FIGS. 6A to 6C, the "TAG" indication is added to the menu item corresponding to the tag provided in the window.

When the menu item indicated by the "TAG" is selected, the screen manager 10a displays a specific display region in the screen corresponding to the selected menu item, that is, the corresponding tag in the window including the specified menu item, at the beginning of the window, and also displays by adding a specific display attribute (for example, highlighting) to show that the function can be executed (that is, an active tag).

For example, when the menu item (Occupied Bandwidth) in the function menu list window 32 is selected, the display range is changed so that the tag "Occupied Bandwidth" in the test result display window 34 may be displayed at the beginning position of the window (position of "Power Test" in FIGS. 6A to C), so that the detail following the tag is displayed without requiring scrolling of the test result display window 34.

Figure 6D:
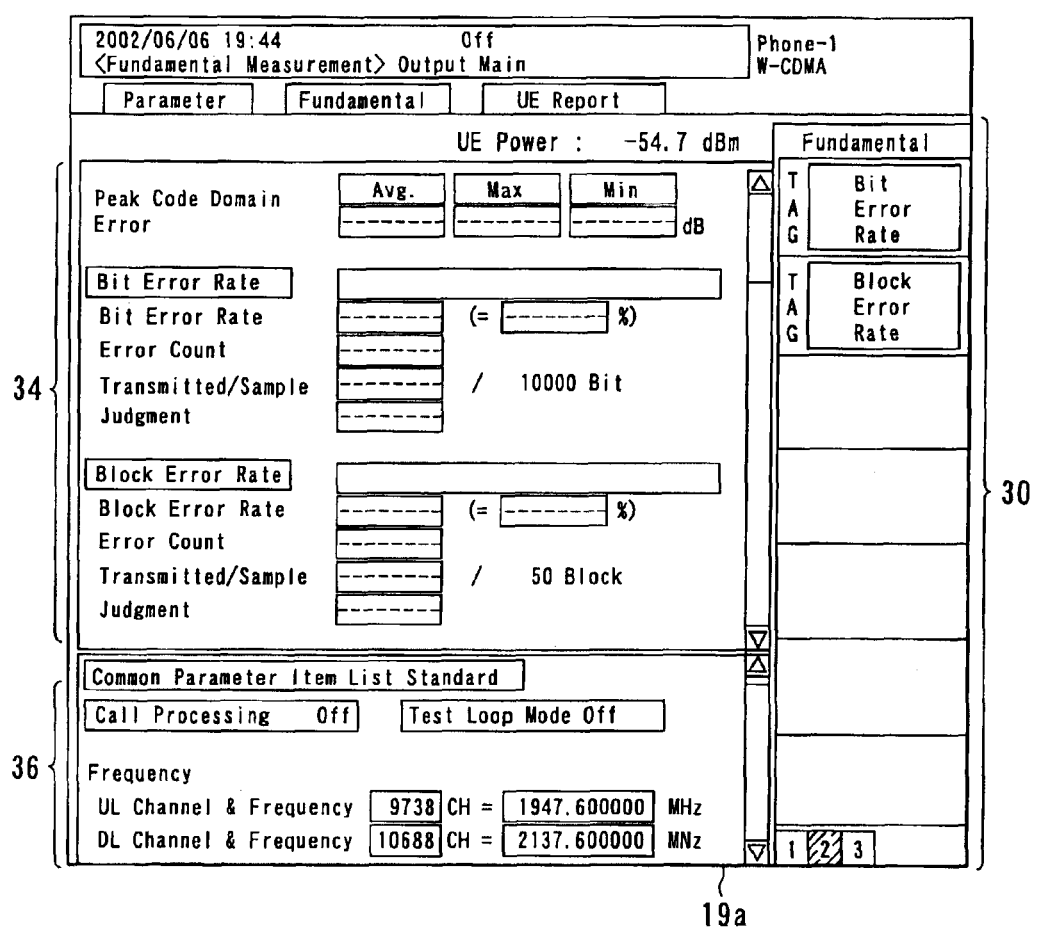

FIG. 6D shows a specific example of the display screen 19a in the case of execution by searching out the menu item required by operating the set key 41 or pressing the encoder 29 as "Block Error Rate" in a column of the second page in the function menu list window 32 is selected by the cursor key 41 in FIG. 6C.

Thus, when the user only manipulates the list display key 24, whether active or inactive, a list of function menus corresponding to each window is displayed, and all function menus assigned in the screen can be easily checked, and a desired menu item can be searched and selected, and executed.

Therefore, when utilizing functions corresponding to plural windows alternately, for example, when repeating the operation of setting of parameters in the parameter setting window 36 and checking of the result of execution of test by the setting on the test result display window 34, the user does not have to make complicated operations of changing over the active windows and displaying necessary tags, by manipulating the page change key 22, focus key 27, cursor key 28, or encoder 29.

In this case, only by displaying the function menu list window 32 by manipulating the list display window 24 and selecting a desired menu item from the window 32, if the desired window is inactive, the portion of the corresponding tag in the pertinent window can be displayed.

That is, if there are multiple functions and multiple function menus are prepared, the user has only to operate the list display key 24, thus the operation is much simplified and the handling efficiency is enhanced.

The technique described in this embodiment may be used as the program to be executed by a computer, and can be presented to various devices by writing into various memory media, for example, magnetic disk (flexible disk, hard disk, etc.), optical disk (CD-ROM, DVD, etc.), or semiconductor memory.

The program can be also presented to devices by transferring through communication media.

The computer for realizing this apparatus reads in the program recorded in the recording media, or receives the program through communication media, and executes the process as the operation is controlled by the program.

Thus, the electronic test apparatus of the invention can easily execute a desired function by selecting from the function menus even when function menus corresponding to multiple functions are provided.

As described herein, according to the invention, only by manipulating the list display key, it has a function of list display of a function menu composed of plural pages arranging plural menu items on one screen used in instruction of execution of mutually different plural functions for processing tested data of objects displayed on a screen. Therefore, even when function menus of plural pages are provided corresponding to multiple functions, the invention presents an electronic test apparatus capable of executing the function easily by selecting the function menu for executing a desired function from the list display of function menus shown on the same screen of the display section.

Also according to the invention, only by manipulating the list display key, it has a function of list display of a function menu composed of plural pages arranging plural menu items on one screen used in instruction of execution of mutually different plural functions for processing tested data of objects displayed on a screen. Therefore, even when function menus of plural pages are provided corresponding to multiple functions, the invention presents a function menu display method of the electronic test apparatus capable of executing the function easily by selecting the function menu for executing a desired function from the list display of function menus shown on the same screen of the display section.

What is claimed is:

1. An electronic test apparatus comprising:
  a testing unit which tests an object;
  a display section which has a screen provided in an operation panel, and displays test data of the object tested by the test unit in a first predetermined region on the screen;
  plural function keys which are provided at predetermined positions close to the screen of the display section in the operation panel, and instruct execution of mutually different plural functions to process the tested data of the object displayed on the screen of the display section;
  a storage section which stores data of plural function menus corresponding to plural function menu items to be used for instructing the execution of mutually different plural functions to process the test data of the object displayed on the screen of the display section, and stores the data of the plural function menus in plural pages when numbers of the plural function menu items are larger than numbers of the plural function keys;
  a screen manager which selectively reads out function menu data of one page corresponding to a predetermined function from the data of the plural function menus stored in the storage section, in correspondence with setting of a display state displayed on the screen of the display section, and displays in a second predetermined region different from the first predetermined region, corresponding to each of the plural function keys on the screen of the display section;
  a list display key which is provided at a predetermined position of the operation panel, and inputs an instruction for executing list display of function menus; and
  a function menu list display section which reads out data of plural function menus of all pages corresponding to the predetermined function from the data of the plural function menus stored in the storage section depending on the operation of the list display key, and presents a list display by relating to page information in a third predetermined region, different from the second predetermined region, including the first predetermined region on the screen of the display section,
  wherein the function menu list display section makes a list of function menus of plural pages when the data of plural function menus of all pages corresponding to the predetermined function cannot be displayed in one page of function menu list due to a limitation of a display size of the screen, and
  the screen manager changes over and displays the function menu list of plural pages created by the function menu list display section, depending on an instruction for changeover of list display.

2. The electronic test apparatus according to claim 1, wherein the screen manager displays the function menu data of the one page by relating with page information when data of plural function menus composed of plural pages is stored in the storage section.

3. The electronic test apparatus according to claim 2, further comprising a page change key provided at a predetermined position in the operation panel,
  wherein the screen manager changes over the data of plural function menus composed of plural pages stored in the storage section, depending on the operation of the page change key, and displays as function menu data the one page.

4. The electronic test apparatus according to claim 1, wherein the screen manager enables selection of at least one corresponding function menu data in the function menu data of one page displayed in the second predetermined position on the screen of the display section, depending on the operation of at least one of the plural function keys.

5. The electronic test apparatus according to claim 1, further comprising:
  plural hard keys provided at predetermined positions in the operation panel, to select a desired specific function menu item from the plural function menu items,
  wherein the screen manager selectively reads out the function menu data of one page corresponding to a desired specific function from the data of plural function menus stored in the storage section, depending on the operation of the plural hard keys, and displays in the second predetermined position corresponding to each of the plural function keys on the screen of the display section.

6. The electronic test apparatus according to claim 1, wherein the function menu list display section unifies function menu items common in each page when making a function menu list, and displays so that the same menu item may not be duplicated in each page on the function menu list.

7. The electronic test apparatus according to claim 1, wherein the function menu list display section sets a function menu list window on the display screen when the execution of list display of function menu is instructed by the list display key while a test result display window and a parameter setting window are displayed on the display screen, and displays the function menu list including the function menus corresponding to the test result display window and function menu list window, and also sets a cursor to select each menu item in the function menu list window, and
  the screen manager changes over the display of the window corresponding to the menu item selected depending on the moving operation of the cursor.

8. The electronic test apparatus according to claim 1, wherein the screen manager displays a specific display region in the screen corresponding to the menu item when an instruction for selecting a specific menu item in the function menu is inputted, and also displays by adding a specific display attribute showing that the function can be executed in the display region.

9. An electronic test apparatus comprising:

a testing unit which tests an object;

a display section which has a screen provided in an operation panel, and displays test data of the object tested by the test unit in a first predetermined region on the screen;

plural function keys which are provided at predetermined positions close to the screen of the display section in the operation panel, and instruct execution of mutually different plural functions to process the tested data of the object displayed on the screen of the display section;

a storage section which stores data of plural function menus corresponding to plural function menu items to be used for instructing the execution of mutually different plural functions to process the test data of the object displayed on the screen of the display section, and stores the data of the plural function menus in plural pages when numbers of the plural function menu items are larger than numbers of the plural function keys;

a screen manager which selectively reads out function menu data of one page corresponding to a predetermined function from the data of the plural function menus stored in the storage section, in correspondence with setting of a display state displayed on the screen of the display section, and displays in a second predetermined region different from the first predetermined region, corresponding to each of the plural function keys on the screen of the display section;

a list display key which is provided at a predetermined position of the operation panel, and inputs an instruction for executing list display of function menus; and a function menu list display section which reads out data of plural function menus of all pages corresponding to the predetermined function from the data of the plural function menus stored in the storage section depending on the operation of the list display key, and presents a list display by relating to page information in a third predetermined region, different from the second predetermined region, including the first predetermined region on the screen of the display section, wherein the function menu list display section makes a list display of function menus including the function menu to be displayed by the screen manager when an execution instruction of the function menu list display is input by the list display key during display of the function menu corresponding to a specific function by the screen manager.

10. The electronic test apparatus according to claim 9, wherein the screen manager displays the function menu data of the one page by relating with page information when data of plural function menus composed of plural pages is stored in the storage section.

11. The electronic test apparatus according to claim 10, further comprising a page change key provided at a predetermined position in the operation panel, wherein the screen manager changes over the data of plural function menus composed of plural pages stored in the storage section, depending on the operation of the page change key, and displays as function menu data the one page.

12. The electronic test apparatus according to claim 9, wherein the screen manager enables selection of at least one corresponding function menu data in the function menu data of one page displayed in the second predetermined position on the screen of the display section, depending on the operation of at least one of the plural function keys.

13. The electronic test apparatus according to claim 9, further comprising:

plural hard keys provided at predetermined positions in the operation panel, to select a desired specific function menu item from the plural function menu items, wherein the screen manager selectively reads out the function menu data of one page corresponding to a desired specific function from the data of plural function menus stored in the storage section, depending on the operation of the plural hard keys, and displays in the second predetermined position corresponding to each of the plural function keys on the screen of the display section.

14. The electronic test apparatus according to claim 9, wherein the function menu list display section unifies function menu items common in each page when making a function menu list, and displays so that the same menu item may not be duplicated in each page on the function menu list.

15. The electronic test apparatus according to claim 9, wherein the function menu list display section sets a function menu list window on the display screen when the execution of list display of function menu is instructed by the list display key while a test result display window and a parameter setting window are displayed on the display screen, and displays the function menu list including the function menus corresponding to the test result display window and function menu list window, and also sets a cursor to select each menu item in the function menu list window, and the screen manager changes over the display of the window corresponding to the menu item selected depending on the moving operation of the cursor.

16. The electronic test apparatus according to claim 9, wherein the screen manager displays a specific display region in the screen corresponding to the menu item when an instruction for selecting a specific menu item in the function menu is inputted, and also displays by adding a specific display attribute showing that the function can be executed in the display region.

17. A method for function menu display of an electronic test apparatus comprising:

preparing a test unit, a display section having a screen, plural function keys, a storage section, and a list display key;

displaying test data at an object tested by the test unit in a first predetermined region on the screen of the display section;

storing in the storage section as data of plural function menus in plural pages if a number of plural function menu items is larger than numbers of plural function keys, when storing data of plural function menus corresponding to plural function menu items to be used in instruction of execution of mutually different plural functions to process the test data of the object displayed on the screen of the display section;

selectively reading out function menu data of one page corresponding to a desired specific function from data of plural function menus stored in the storage section, in correspondence with setting of a display state displayed on the screen of the display section, and displaying in a second predetermined region different from the first predetermined region, corresponding to each one of the plural function keys on the screen of the display section;

inputting an instruction for executing a list display of function menus by operating the list display key;

reading out data of plural function menus of all pages stored in the storage section depending on the operation of the list display key, and presenting a list display by relating to page information in a third predetermined region, different from the second predetermined region, including the first predetermined region on the screen of the display section, and creating a list of function menus of plural pages when the data of plural function menus of all pages corresponding to the specified function cannot be displayed in one page of function menu list due to a limitation of the display screen size; and changing over and displaying the list of function menu plural pages, depending on a changeover instruction of list display.

18. The method for function menu display of an electronic test apparatus according to claim 17, further comprising:

displaying the function menu data of the one page by relating to page information when the function menu data of one page is stored as data of plural function menus composed of plural pages in the storage section.

19. The method for function menu display of an electronic test apparatus according to claim 18, further comprising:

preparing a page change key; and displaying the function menu data of the one page as function menu data of the one page by changing over the data of plural function menus of plural pages stored in the storage section, depending on the operation of the page change key.

20. The method for function menu display of an electronic test apparatus according to claim 17, further comprising:

enabling selection of at least one corresponding function menu data, out of the function menu data of one page displayed in the second predetermined region on the screen of the display section, depending on the operation of at least one of the plural function keys.

21. The method for function menu display of an electronic test apparatus according to claim 17, further comprising:

preparing plural hard keys to select a desired specific function menu item from the plural function menu items; and selectively reading out the function menu data of one page corresponding to a desired specific function from the data of plural function menus stored in the storage section, depending on the selective operation of the plural hard keys, and displaying in the second predetermined region corresponding to each one of the plural function keys on the screen of the display section.

22. The method for function menu display of an electronic test apparatus according to claim 17, further comprising:

unifying function menu items common in each page when making the function menu list, and displaying the function menu list so that the same menu item may not be duplicated in each page on the function menu list.

23. The method for function menu display of an electronic test apparatus according to claim 17, wherein a function menu list window is set on the display screen, for the function menu list display, when the execution of lists display of a function menu is instructed by the list display key while a test result display window and a parameter setting window are displayed on the display screen, and the function menu list including the function menus corresponding to the test result display window and the function menu list window is displayed, and also a cursor to select each menu item in the function menu list window is set, and the display of the window is changed over corresponding to the menu item selected depending on a movement of the cursor.

24. The method for function menu display of an electronic test apparatus according to claim 17, wherein for display of the function menu data of one page, a specific display region in the screen corresponding to the menu item is displayed when an instruction for selecting a specific menu item in the function menu is inputted, and is also displayed by adding a specific display attribute showing that the function can be executed in the display region.

25. A method for function menu display of an electronic test apparatus comprising:

preparing a test unit, a display section having a screen, plural function keys, a storage section, and a list display key;

displaying test data of art object tested by the test unit in a first predetermined region on the screen of the display section;

storing in the storage section as data of plural function menus in plural pages if a number of plural function menu items is larger than numbers of plural function keys, when storing data of plural function menus corresponding to plural function menu items to be used in instruction of execution of mutually different plural functions to process the test data of the object displayed on the screen of the display section;

selectively reading out function menu data of one page corresponding to a desired specific function from data of plural function menus stored in the storage section in correspondence with setting of a display state displayed on the screen of the display section, and displaying in a second predetermined region different from the first predetermined region, corresponding to each one of the plural function keys on the screen of the display section;

inputting an instruction for executing a list display of function menus by operating the list display key; and reading out data of plural function menus of all pages stored in the storage section depending on the operation of the list display key, and presenting a list display by relating to page information in a third predetermined region, different from the second predetermined region, including the first predetermined region on the screen of the display section, wherein for display of the function menu list, a list of function menus including the function menu to be displayed is displayed when an instruction of execution of function menu list display is inputted by the list display key during display of the function menu corresponding to the specific function.

26. The method for function menu display of an electronic test apparatus according to claim 25, further comprising:

displaying the function menu data of the one page by relating to page information when the function menu data of one page is stored as data of plural function menus composed of plural pages in the storage section.

27. The method for function menu display of an electronic test apparatus according to claim 26, further comprising:

preparing a page change key; and displaying the function menu data of the one page as function menu data of the one page by changing over the data of plural function menus of plural pages stored in the storage section, depending on the operation of the page change key.

28. The method for function menu display of an electronic test apparatus according to claim 25, further comprising:

enabling selection of at least one corresponding function menu data, out of the function menu data of one page displayed in the second predetermined region on the screen of the display section, depending on the operation of at least one of the plural function keys.

29. The method for function menu display of an electronic test apparatus according to claim 25, further comprising:

preparing plural hard keys to select a desired specific function menu item from the plural function menu items; and selectively reading out the function menu data of one page corresponding to a desired specific function from the data of plural function menus stored in the storage section, depending on the selective operation of the plural hard keys, and displaying in the second predetermined region corresponding to each one of the plural function keys on the screen of the display section.

30. The method for function menu display of an electronic test apparatus according to claim 25, further comprising:

unifying function menu items common in each page when making the function menu list, and displaying the function menu list so that the same menu item may not be duplicated in each page on the function menu list.

31. The method for function menu display of an electronic test apparatus according to claim 25, wherein a function menu hat window is set on the display screen, for the function menu list display, when the execution of lists display of a function menu is instructed by the list display key while a test result display window and a parameter setting window are displayed on the display screen, and the function menu list including the function menus corresponding to the test result display window and the function menu list window is displayed, and also a cursor to select each menu item in the function menu list window is set, and the display of the window is changed over corresponding to the menu item selected depending cm a movement of the cursor.

32. The method for function menu display of an electronic test apparatus according to claim 25, wherein for display of the function menu data of one page, a specific display region in the screen corresponding to the menu item is displayed when an instruction for selecting a specific menu item in the function menu is inputted, and is also displayed by adding a specific display attribute showing that the function can be executed in the display region.

* * * * *